(12) United States Patent
Dittmann

(10) Patent No.: US 8,495,542 B2
(45) Date of Patent: Jul. 23, 2013

(54) AUTOMATED MANAGEMENT OF VERIFICATION WAIVERS

(75) Inventor: Gero Dittmann, Frankfurt a.M. (DE)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 13/234,952

(22) Filed: Sep. 16, 2011

(65) Prior Publication Data

US 2012/0072878 A1  Mar. 22, 2012

(30) Foreign Application Priority Data

Sep. 16, 2010 (EP) ..................... 10177094

(51) Int. Cl.
*G06F 17/50* (2006.01)

(52) U.S. Cl.
USPC ............................ 716/112; 716/111; 716/136

(58) Field of Classification Search
None
See application file for complete search history.

(56) References Cited

U.S. PATENT DOCUMENTS

| | | | |
|---|---|---|---|
| 6,418,551 B1 | 7/2002 | McKay et al. | |
| 7,367,006 B1 * | 4/2008 | O'Riordan et al. | 716/102 |
| 7,882,472 B2 * | 2/2011 | Sardino et al. | 716/113 |
| 8,091,055 B2 * | 1/2012 | Brelsford et al. | 716/111 |
| 2005/0188336 A1 * | 8/2005 | Mortensen et al. | 716/5 |
| 2007/0124709 A1 | 5/2007 | Li et al. | |
| 2007/0192754 A1 * | 8/2007 | Hofsaess | 716/5 |
| 2010/0064269 A1 | 3/2010 | Lai et al. | |
| 2010/0070936 A1 | 3/2010 | Lakshmanan et al. | |
| 2010/0257496 A1 * | 10/2010 | Ferguson et al. | 716/5 |

OTHER PUBLICATIONS

John Ferguson et al., "An Innovative Method to Automate the Waiver of IP-Level DRC Violations," 11th Int' Symposium on Quality Electronic Design, Mar. 2010, pp. 493-498.*
Jason Puryear, "Enhancing the DRC Waiver Methodology for Layout Verification Productivity," White Paper, Synopsys, May 2009, 11 pages. (http://www.synopsys.com/tools/implementation/physicalverification/capsulemodule/drc_layout_wp.pdf).*
"Calibre DRC Automated Waiver Technology", http://spectrum.ieee.org/webinar/1504908 Jan. 26, 2010 , 2 pages.

* cited by examiner

*Primary Examiner* — Leigh Garbowski
(74) *Attorney, Agent, or Firm* — DeLizio Gilliam, PLLC

(57) ABSTRACT

Automated management of verification waivers is disclosed. In one embodiment a method is provided comprising issuing a request to perform a verification run on a component of an electric circuit design, receiving configuration data specifying a list of waivers extracted from a plurality of waivers applicable to the electric circuit design as a whole where the list of waivers is extracted based on waiver validity period data and is applicable to the component rather than the electric circuit design as a whole. The described method further comprises identifying a potential design defect and generating a verification run result including a set of design defects of the component, the set including the potential design defect if no waiver of the list of waivers is determined to be applicable.

15 Claims, 6 Drawing Sheets

AUTOMATED MANAGEMENT OF VERIFICATION WAIVERS

RELATED MATTERS

The application claims priority to European Patent Application Number 101770949 filed Sep. 16, 2010 entitled "Method and Circuit Arrangement to Verify an Electronic Circuit Design, Data Processing Program, and Computer Program Product".

BACKGROUND

The present invention relates in general to the field of verification of electronic circuit designs, and in particular to a method to verify an electronic circuit design and a circuit arrangement to verify an electronic circuit design. Still more particularly, the present invention relates to a data processing program and a computer program product to verify an electronic circuit.

In the verification of complex chip logic designs today verification engineers waive a large number of defects that they deem tolerable to leave unfixed for various reasons. Responsibility for granting waivers is distributed across teams and so is the information regarding which waivers have been granted. Moreover, many waivers have an expiration date by which the defect is expected to be fixed, e.g., after a particular chip release. Finally, waivers are typically documented in a defect tracking system in an unstructured format, giving the type of defect, the exact affected component on the chip and the person granting the waiver in plain English. Some known tracking systems offer a coarse possibility to name sub-systems of the chip in which a found defect is located.

Automatic determination of whether hardware design defects should be waived using a hardware design verification tool, e.g. design rule checker (DRC), electrical rule checker (ERC), structural verification tool, etc. in order to suppress error messages is not currently possible. A waiver is comprised of a hardware component identifier, e.g. a name and an associated defect type, preferably with a hierarchy information, e.g. an hierarchical name <Top Level Name>.<Level2 Name> . . . <Bottom Level Name> as a hierarchical waiver. For example, a waiver list can be implemented as a file with each line containing the defect type and the hierarchical signal name. Another example is to use multiple files, wherein a file is associated to a defect type and contains only the hierarchical signal names per line.

In the Patent Application Publication US 2005/0188336 A1 "SYSTEM AND METHOD FOR WAIVING A VERIFICATION CHECK" by Mortensen et al. a system and method for waiving verification check associated with a circuit design is disclosed. According to the disclosed system and method a first engine integrates waiver options associated with the circuit design's objects into a hierarchical verification tree having the verification check. A second engine traverses a portion of the hierarchical verification tree to determine a list of applicable waivers. A third engine resolves the list of applicable waivers to determine the disposition of the verification check violation. The third engine combines multiple hierarchical waivers to determine if a defect is waived or not, and needs to query a database for each defect found by the verification separately. The used waivers are defined by a hardware component identifier and an associated defect type only.

SUMMARY

Embodiments of the present invention provide automated management of verification waivers. According to one embodiment of the present invention, a method is provided comprising issuing, via a design verification tool, a request to perform a verification run on a component of an electric circuit design. The method further comprises receiving, at the design verification tool and in response to an issuance of the request, configuration data specifying a list of waivers extracted from a plurality of waivers applicable to the electric circuit design as a whole, where the list of waivers is extracted based upon waiver validity period data specifying at least one of a waiver expiration date and a waiver grant date, and the list of waivers is applicable to the component of the electric circuit design rather than the electric circuit design as a whole.

The described method embodiment also comprises identifying, utilizing the design verification tool, a potential design defect of the component of the electric circuit design and generating a verification run result including a set of design defects of the component, where the set of design defects includes the potential design defect in response to a determination that no waiver of the list of waivers is applicable to the potential design defect and excludes the potential design defect in response to a determination that at least one waiver of the list of waivers is applicable to the potential design defect.

According to another embodiment of the present invention, a computer program product is provided for performing the above-described method.

According to yet another embodiment of the present invention, a circuit arrangement to verify an electronic circuit design utilizing a design verification tool is provided, said circuit arrangement comprising an entry tool; a control unit; a visualizing tool; and a database of defined waivers comprising a plurality of entries, each entry of the plurality of entries corresponding to a waiver and comprising a hardware component identifier and an associated defect type. In the described circuit arrangement embodiment, the design verification tool, during a verification run, ignores a found design defect in response to a determination that a corresponding waiver, defined to waive the found design defect, is present in the database of defined waivers, and each entry of the plurality of entries is further defined by metadata.

The above, as well as additional purposes, features, and advantages of the present invention will become apparent in the following detailed written description.

BRIEF DESCRIPTION OF THE DRAWINGS

A preferred embodiment of the present invention, as described in detail below, is shown in the drawings, in which.

DESCRIPTION OF EMBODIMENT(S)

Figure 1:
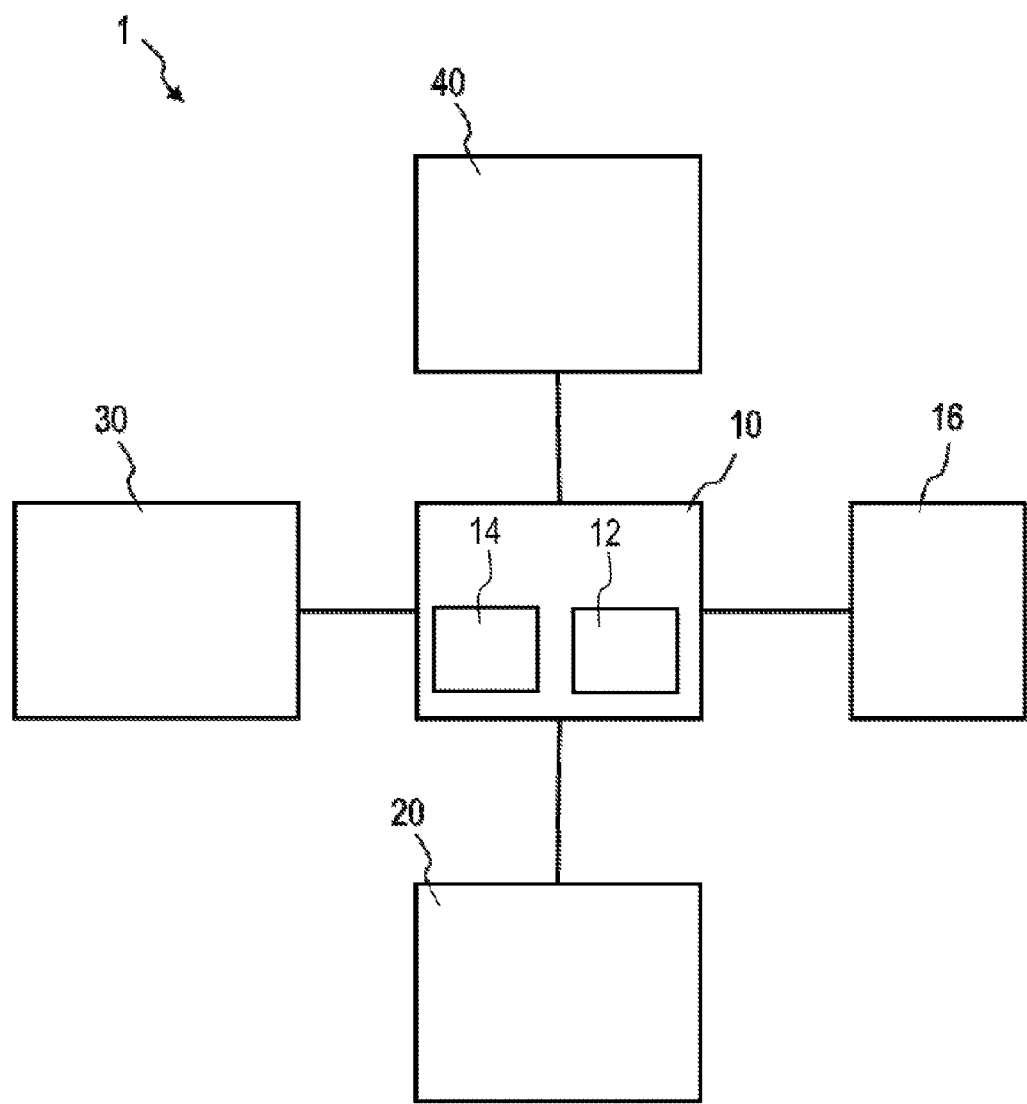
FIG. 1 is a schematic block diagram of a circuit arrangement to verify an electronic circuit design, in accordance with an embodiment of the present invention.
Figure 2:
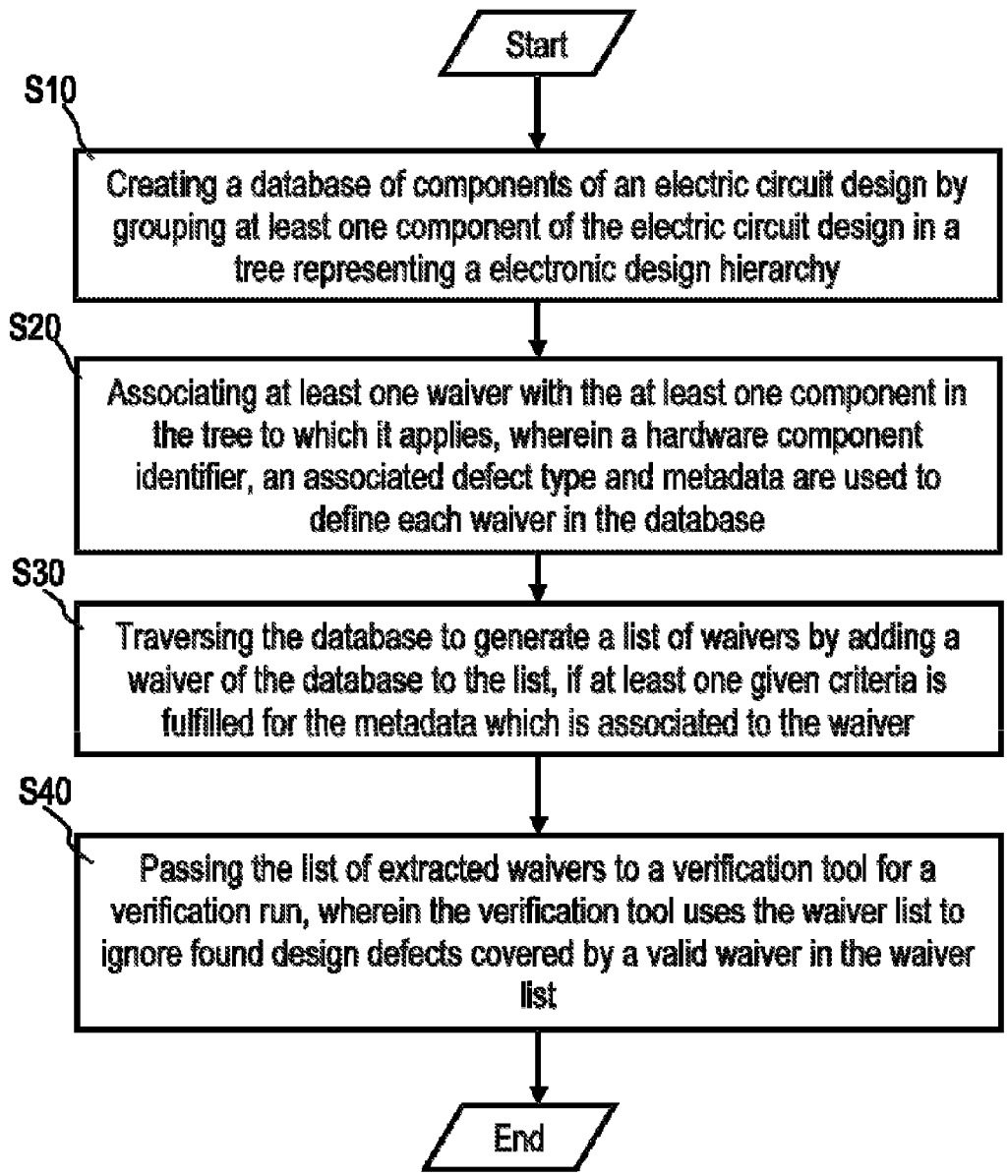
FIG. 2 is a schematic flow diagram of a method to verify an electronic circuit design, in accordance with an embodiment of the present invention.

Embodiments of the present invention provide for the automated management of verification waivers. FIG. 1 is a schematic block diagram of a circuit arrangement to verify an electronic circuit design, in accordance with an embodiment of the present invention, and FIG. 2 is a schematic flow diagram of a method to verify an electronic circuit design, in accordance with an embodiment of the present invention.

Referring to FIG. 1, the shown embodiment of the present invention employs an arrangement 1 to verify an electronic circuit design by a design verification tool 12 comprising an entry tool 30, a control unit 10, a visualizing tool 40 and a database 20 of defined waivers with a hardware component identifier and an associated defect type. During verification run the design verification tool 12 ignores a found design defect if it finds a corresponding waiver defined to waive the found design defect in the waiver database 20. According to the present invention each waiver in the database 20 is further defined by metadata. For example, the metadata comprise at least one of the following: Responsibility data, association data or expiration data. An example of such a waiver is shown in Table 1.

TABLE 1

| Defect type | Tracking ID | Author | Entry/ Grant Date | Expiration Date | Component |
|---|---|---|---|---|---|
| NotConnected | HW312 | Jane Doe | 2010-05-04 | 2010-08-19 | Processor.LSU.StatusLatch14 |

Referring to Table 1 the shown waiver comprises a hardware component identifier (Component) with hierarchy information, e.g. hierarchical name <Top Level Name>.<Level2 Name> . . . <Bottom Level Name>, and an associated defect type. For example, a waiver list can be implemented as a file with each line containing the defect type and the hierarchical signal name. Another example is to use multiple files, wherein a file is associated to a defect type and contains only the hierarchical signal names per line. In the shown example, the metadata comprises validity period information specified by expiration date and/or grant date, responsibility data specified by author information and grant data, and association data specified as tracking ID representing an entry in a defect tracking system. The entry tool 30 is used to modify current database content and/or to enter new waivers.

In the verification of complex chip logic designs today verification engineers waive a large number of defects that they deem tolerable to leave unfixed for various reasons. The responsibility for granting waivers is distributed across teams and the information which waivers have been granted is stored in the database 20. The expiration date represents a date by which the defect is expected to be fixed, e.g., after a particular chip release. The waivers are documented in the database 20 in a structured format, giving the type of defect, the affected component on the chip, i.e. in the electric circuit design, the person granting the waiver, grant date and expiration date.

Referring to FIG. 2 in step S10 the database 20 of components of the electronic circuit design to be verified is created by grouping the components in a tree representing a hierarchy of the corresponding electronic circuit. In step S20 at least one waiver is associated to at least one component in the tree to which it applies. According to the present invention hardware component identifier, associated defect type, and metadata comprising responsibility data, association data and/or expiration data are used to define each waiver in the database 20. According to step S30 the database 20 is traversed to generate a list 16 of waivers by adding a waiver of the database 20 to the list 16 if at least one given criteria is fulfilled for the metadata which is associated to the waiver. To traverse the database 20 to generate the list 16 of waivers the waiver extractor 14, shown in FIG. 1 may be used. The waiver extractor 14 may use, e.g., the depth-first search algorithm and/or the breadth-first search algorithm to traverse the database 20. The given criteria may comprise hierarchy information, waiver validity period information and/or responsibility data.

Additionally, the waiver extractor 14 may be used to visualize waiver data over time, to filter out-of-scope waivers, and/or to track waiver responsibility. So granting waivers, pruning expired waivers, consolidating waivers in a configuration file for a verification run on a particular part of the chip, correlating the output of the verification tools with previously seen waivers, and associating waivers with existing tracker entries are done by using embodiments of the present invention.

In step S40 the list 16 of extracted waivers is passed to the design verification tool 12 for a verification run, wherein the design verification tool 12 uses the waiver list 16 to ignore found design defects covered by a valid waiver in the waiver list 16. The design verification tool 12 may be implemented, e.g., as design rule checker (DRC), electrical rule checker (ERC), and/or structural verification.

Figure 3:
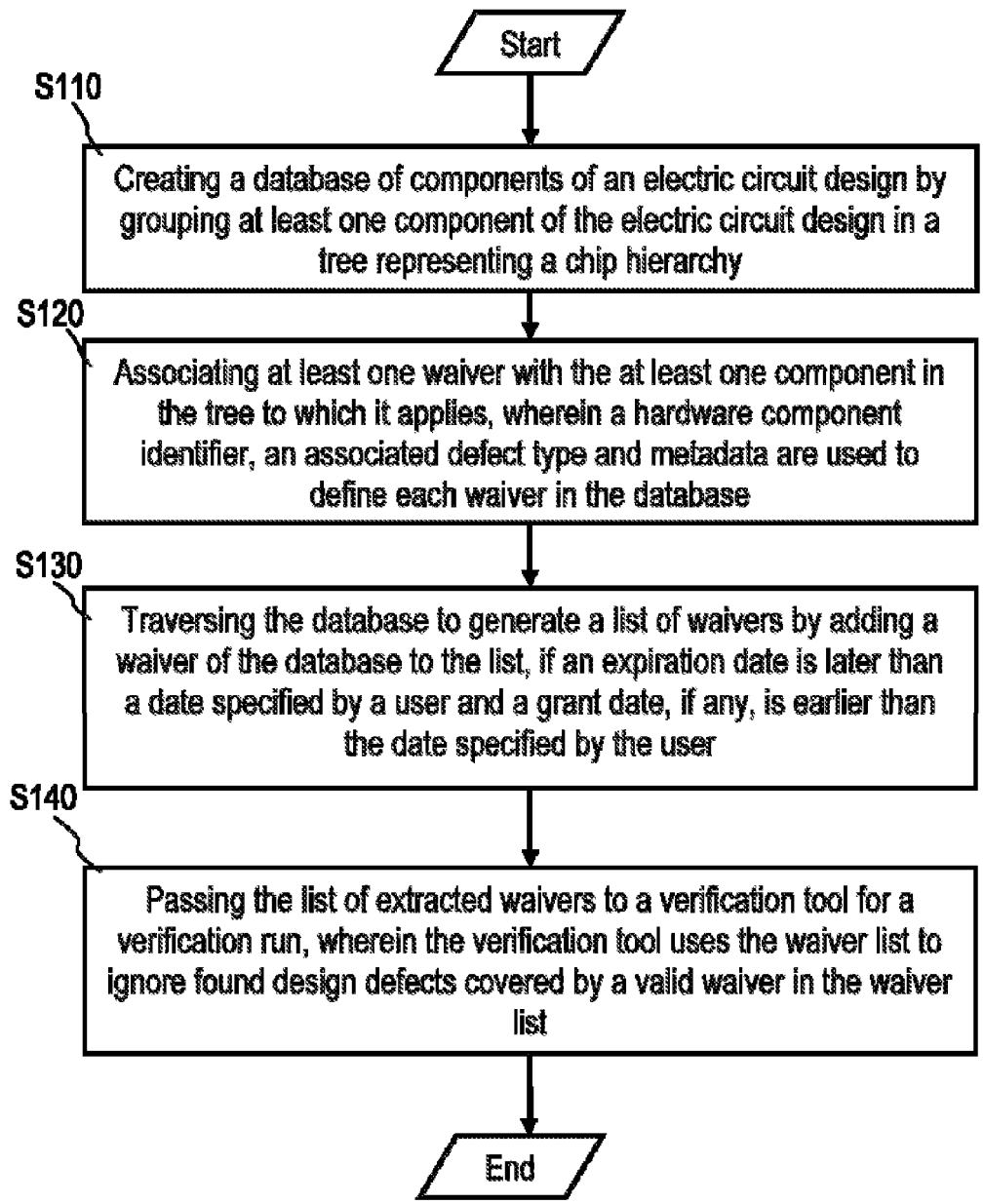
FIG. 3 is a schematic flow diagram of a method to verify an electronic circuit design, in accordance with an embodiment of the present invention, wherein waivers are extracted by validity period information.

FIG. 3 is a schematic flow diagram of a method to verify an electronic circuit design, in accordance with an embodiment of the present invention, wherein waivers are extracted by validity period information.

Referring to FIG. 3 in step S110 the database 20 of components of the electronic circuit design to be verified is created by grouping the components in a tree representing a hierarchy of the corresponding electronic circuit. In step S120 at least one waiver is associated to at least one component in the tree to which it applies. As in FIG. 2 hardware component identifier, associated defect type, and metadata comprising responsibility data, association data and/or expiration data are used to define each waiver in the database 20. According to step S130 the database 20 is traversed to generate the list 16 of waivers by adding a waiver of the database 20 to the list 16 if an expiration date is later than a date specified by a user and a grant date, if any is earlier than the user-specified date. According to FIG. 3, the waiver extractor 14 uses validity period information specified by expiration date and/or grant date to generate the list 16 of waivers. In step S140 the list 16 of extracted waivers is passed to the design verification tool 12 for a verification run, wherein the design verification tool 12 uses the waiver list 16 to ignore found design defects covered by a valid waiver in the waiver list 16.

Figure 4:
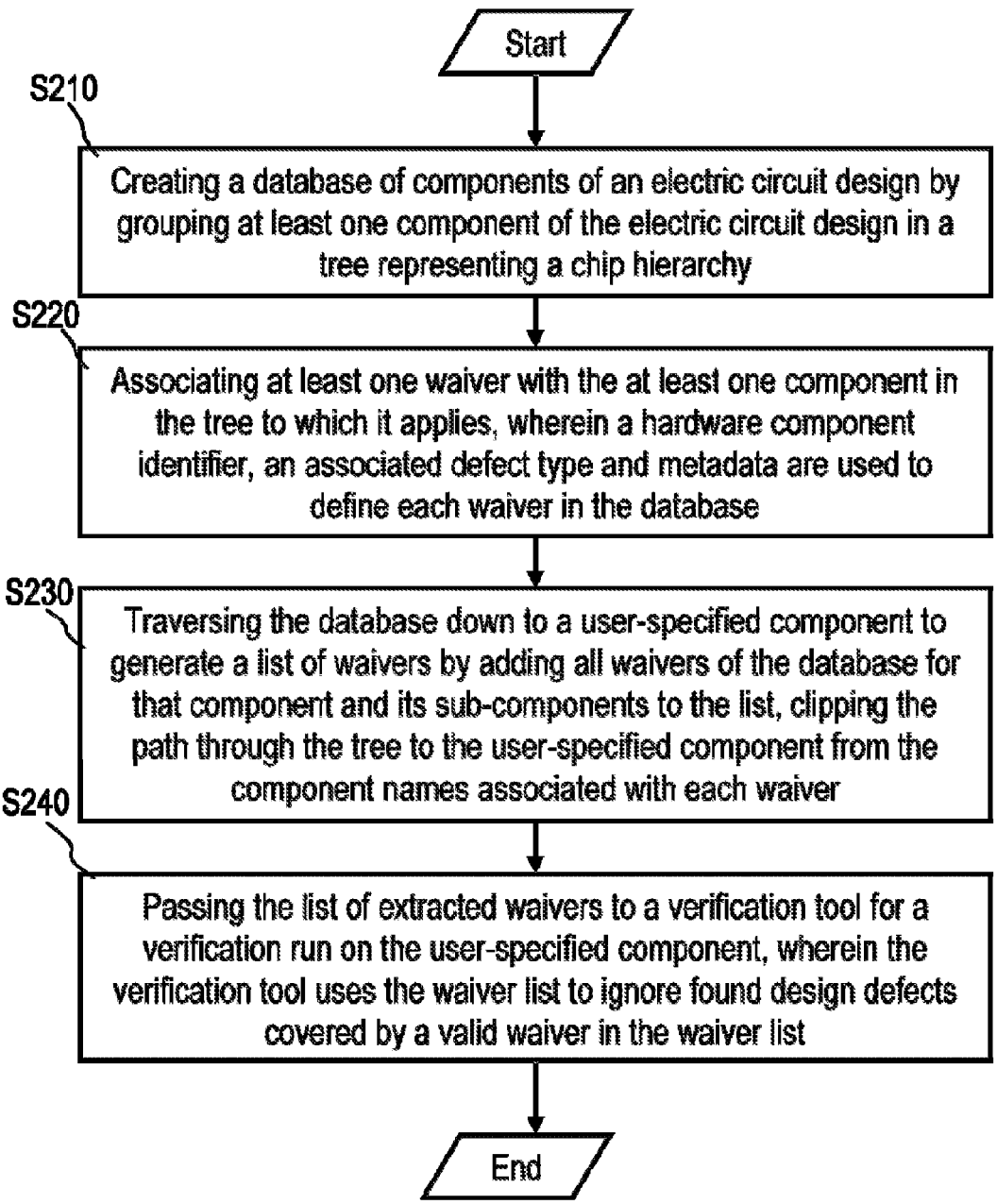
FIG. 4 is a schematic flow diagram of a method to verify an electronic circuit design, in accordance with an embodiment of the present invention, wherein waivers are extracted by hierarchy information.

FIG. 4 is a schematic flow diagram of a method to verify an electronic circuit design, in accordance with an embodiment of the present invention, wherein waivers are extracted by hierarchy information.

Referring to FIG. 4 in step S210 the database 20 of components of the electronic circuit design to be verified is created by grouping the components in a tree representing a hierarchy of the corresponding electronic circuit. In step S220 at least one waiver is associated to at least one component in the tree to which it applies. As in FIGS. 2 and 3 hardware component identifier, associated defect type, and metadata comprising responsibility data, association data and/or expiration data are used to define each waiver in the database 20. According to step S230 the database 20 is traversed down to a user-specified component to generate the list 16 of waivers by adding all waivers of the database 20 for that component and its sub-components to the list 16, clipping the path through the tree to the user-specified component from the component names associated with each waiver. According to FIG. 4, the waiver extractor 14 uses hierarchy information specified by a particular user-specified component to generate the list 16 of waivers. In step S240 the list 16 of extracted waivers is passed to the design verification tool 12 for a verification run on the user-specified component, wherein the design verification tool 12 uses the waiver list 16 to ignore found design defects covered by a valid waiver in the waiver list 16.

Figure 5:
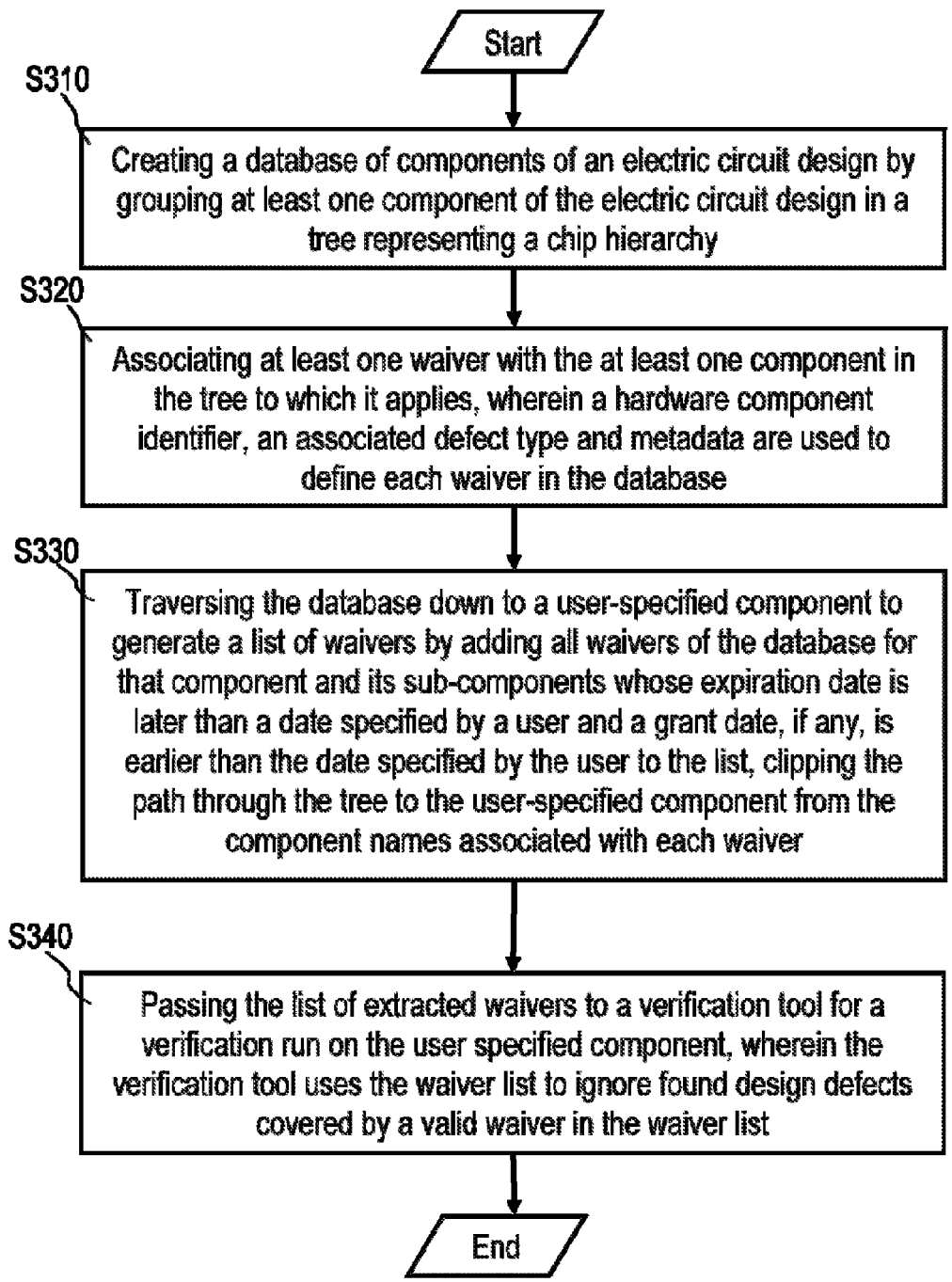
FIG. 5 is a schematic flow diagram of a method to verify an electronic circuit design, in accordance with an embodiment of the present invention, wherein waivers are extracted by hierarchy and validity period information.

FIG. 5 is a schematic flow diagram of a method to verify an electronic circuit design, in accordance with an embodiment of the present invention, wherein waivers are extracted by hierarchy and validity period information.

Referring to FIG. 5 in step 310 the database 20 of components of the electronic circuit design to be verified is created by grouping the components in a tree representing a hierarchy of the corresponding electronic circuit. In step S320 at least one waiver is associated to at least one component in the tree to which it applies. As in FIGS. 2 to 4 hardware component identifier, associated defect type, and metadata comprising responsibility data, association data and/or expiration data are used to define each waiver in the database 20. According to step S330 the database 20 is traversed down to a user-specified component to generate the list 16 of waivers by adding all waivers of the database 20 for that component and its sub-components whose expiration date is later than a date specified by a user and a grant date, if any is earlier than the user-specified date to the list 16, clipping the path through the tree to the user-specified component from the component names associated with each waiver. According to FIG. 5, the waiver extractor 14 uses hierarchy information specified by a particular user-specified component and validity period information specified by expiration date and/or grant date to generate the list 16 of waivers. In step S340 the list 16 of extracted waivers is passed to the design verification tool 12 for a verification run on the user-specified component, wherein the design verification tool 12 uses the waiver list 16 to ignore found design defects covered by a valid waiver in the waiver list 16.

Figure 6:
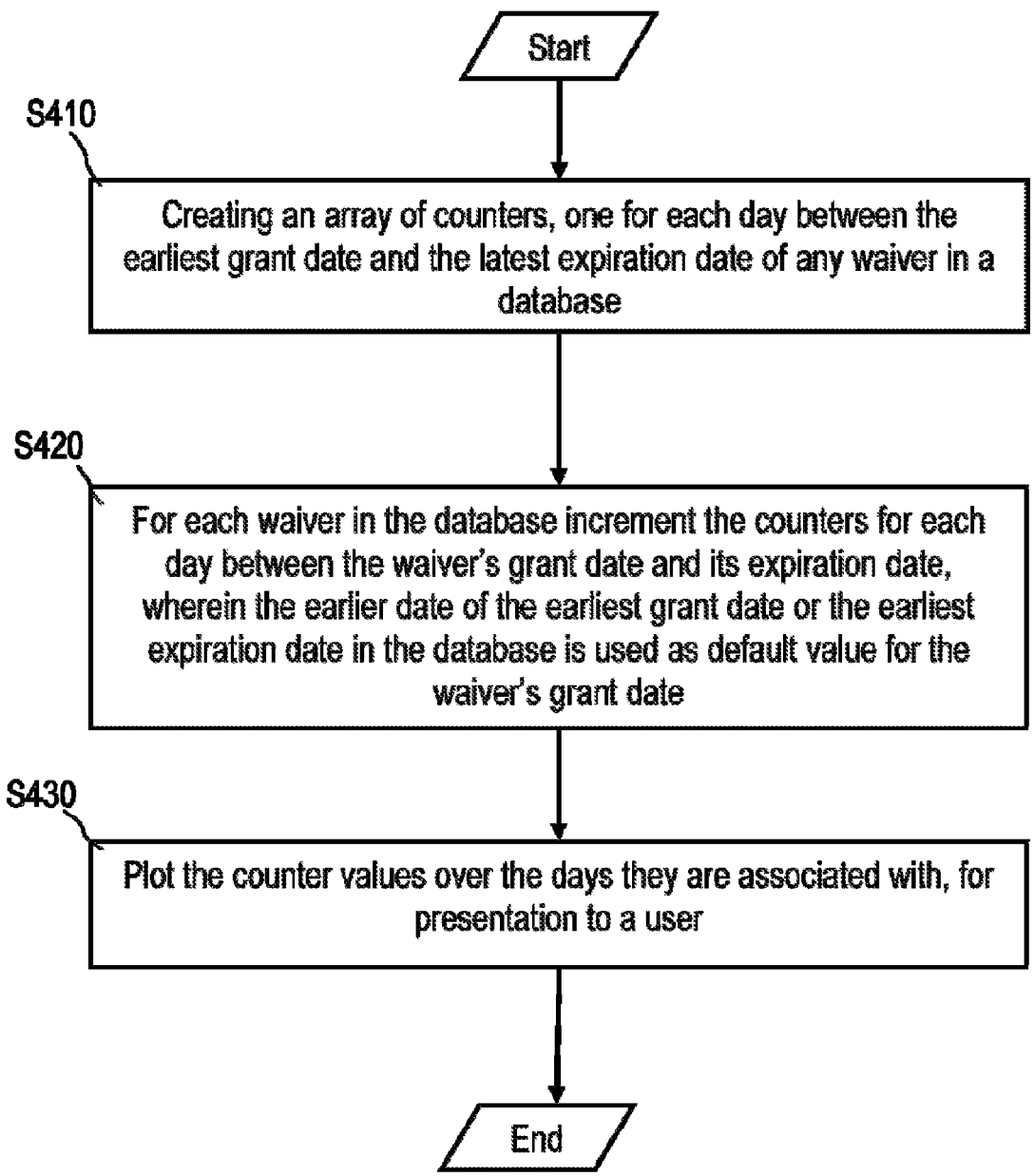
FIG. 6 is a schematic flow diagram of a process to visualize waivers over time.

FIG. 6 is a schematic flow diagram of a process to visualize waivers over time.

Referring to FIG. 6, in step S410 an array of counters is created one for each day between earliest grant date and latest expiration date of any waiver in the database 20. In step S420 for each waiver in the database 20, corresponding counters are incremented for each day between the waiver's grant date and expiration date. As default value for the grant date the earliest grant date or the earliest expiration date in the database 20 are used, whichever is earlier. In step S430 the counter values over the days they are associated with are plotted and presented to a user.

The inventive method to verify an electronic circuit design by a design verification tool can be implemented entirely as a software embodiment, or an embodiment containing both hardware and software elements. In a preferred embodiment, the present invention is implemented in software, which includes but is not limited to firmware, resident software, microcode, etc.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In the foregoing detailed description, numerous details have been set forth in order to provide a thorough understanding of the present claimed subject matter. However, it will be understood by those skilled in the art that the claimed subject matter may be practiced without these specific details. In other instances, well-known methods, procedures, components, and circuits have not been described in detail so as to not obscure the claimed subject matter. Similarly, while specific embodiments have been presented herein, various alternative embodiments are contemplated within the scope of the present invention.

According to one alternative embodiment, a method is provided to verify an electronic circuit design and a circuit arrangement to verify an electronic circuit design, which are able to improve the verification of an electronic circuit design by a design verification tool using at least one waiver and to overcome previously-mentioned shortcomings of conventional design verification tools, and to provide a data processing program and a computer program product to perform the method to verify an electronic circuit design.

Accordingly, in an embodiment of the present invention a method to verify an electronic circuit design by a design verification tool comprises ignoring a found design defect if a corresponding waiver is defined to waive the found design defect, wherein the verification tool uses a database of defined waivers with a hardware component identifier and an associated defect type. According to the described alternative embodiment, metadata are used to further define each waiver in the database.

In further embodiments of the present invention, the metadata comprise at least one of the following: responsibility data, association data or expiration data.

In further embodiments of the present invention, the database comprises at least one component of the electric circuit design grouped in a tree representing a corresponding electric circuit hierarchy, wherein at least on waiver is associated to the at least one component.

In further embodiments of the present invention, the database is traversed to generate a list of waivers by adding a waiver of the database to the list if at least one given criteria is fulfilled for the metadata which is associated to the waiver.

In further embodiments of the present invention, the given criteria comprise hierarchy information, wherein only waivers for a particular component and its sub-components of the electronic circuit design are extracted to the list.

In further embodiments of the present invention, the given criteria comprise waiver validity period information specified by expiration date and/or grant date.

In further embodiments of the present invention, the given criteria comprise responsibility data with author information to track waiver responsibility.

In further embodiments of the present invention, the given criteria comprise visualizing waiver data over time, wherein an array of counters is created, one for each day between earliest grant date and latest expiration date of any waiver in the database, wherein for each waiver in the database corresponding counters are incremented for each day between the waivers grant date and expiration date.

In further embodiments of the present invention, an entry tool is used to modify current database content and/or to enter new waivers.

In another embodiment of the present invention, a circuit arrangement to verify an electronic circuit design by a design verification tool comprises an entry tool, a control unit, a visualization tool and a database of defined waivers with a hardware component identifier and an associated defect type, wherein the design verification tool during verification run ignores a found design defect if it finds a corresponding waiver defined to waive the found design defect in the waiver database, wherein each waiver in the database is further defined by metadata.

In further embodiments of the present invention, a waiver extractor is used to traverse the database to generate a list of waivers by adding a waiver of the database to the list if at least one given criteria is fulfilled for the metadata which is associated to the waiver.

In another embodiment of the present invention, a data processing program for execution in a data processing system comprises software code portions for performing a method to verify an electronic circuit design when the program is run on the data processing system.

In yet another embodiment of the present invention, a computer program product stored on a computer-usable medium, comprises computer-readable program means for causing a computer to perform a method to verify an electronic circuit design when the program is run on the computer.

Embodiments of the present invention may be utilized to automate processes of granting waivers, pruning expired waivers, consolidating waivers in a configuration file for a verification run on a particular part of the electronic circuit design, correlating the output of the verification tools with previously seen waivers, and associating waivers with existing tracker entries. Advantageously, embodiments of the present invention are ignoring defects or are not testing defects if a corresponding waiver is defined so that computing time or error reports are reduced.

All in all, embodiments of the present invention address the verification of an electronic circuit. Embodiments of the present invention employ a database that correlates each component in the logic design with waivers involving the component. Each waiver, in turn, is associated with a waiver type determining what kind of problem is being waived, an entry in a defect tracking system documenting it, and metadata like expiration data, e.g., a release identifier or date by which the problem is scheduled to be fixed, as well as responsibility data like entry time and author.

Embodiments of the present invention further comprise a waiver extractor which determines the subset of waivers for a given part of the electronic circuit design hierarchy that is valid for a given release, considering waiver expiration. The waiver subset is passed on to a verification tool in a machine-readable format to be run on a model of said release of said electronic circuit design part.

The restriction to only applicable waivers has the advantages of preventing undetected problems hidden by expired waivers, preventing tool warnings due to waivers that are out of the scope of the model under verification, and the ability to prune hierarchy levels from component names that are not part of the model under verification and that the tool, therefore, would not understand.

In yet another embodiment of the present invention, a visualizing tool extracts information from the database and presents it to the user, e.g., all waivers in a table with entry time and author to track accountability, or a graph plotting the number of waivers over time. An entry tool presents the user with the current database content and provides means to modify data or enter new waivers, e.g., in a graphical user-interface or a command-line interface.

What is claimed is:

1. A method comprising:
   issuing, via a design verification tool, a request to perform a verification run on a component of an electric circuit design;
   receiving, at said design verification tool and in response to an issuance of said request, configuration data specifying a list of waivers extracted from a plurality of waivers applicable to said electric circuit design as a whole, wherein
      said list of waivers is extracted based upon waiver validity period data specifying at least one of a waiver expiration date and a waiver grant date, and
      said list of waivers is applicable to said component of said electric circuit design rather than said electric circuit design as a whole;
   identifying, utilizing said design verification tool, a potential design defect of said component of said electric circuit design; and
   generating a verification run result including a set of design defects of said component of said electric circuit design, wherein
      said set of design defects includes said potential design defect in response to a determination that no waiver of said list of waivers is applicable to said potential design defect, and
      said set of design defects excludes said potential design defect in response to a determination that at least one waiver of said list of waivers is applicable to said potential design defect.

2. The method of claim 1, further comprising
   extracting said list of waivers utilizing a database of defined waivers comprising a plurality of entries, wherein each entry is associated with a hardware component identifier, an associated defect type, and metadata.

3. The method of claim 2, wherein said metadata comprises at least one of responsibility data, association data, and expiration data.

4. The method of claim 2, wherein
   said database comprises at least one component of said electric circuit design grouped in a tree representing a corresponding electronic circuit hierarchy, wherein at least one waiver is associated with at least one of said at least one component; and
   said extracting comprises traversing said plurality of entries of said database to generate said list of waivers.

5. The method of claim 2, wherein
   said method further comprises visualizing waiver data over time; and
   said visualizing comprises,
      creating an array of counters, each of said array of counters corresponding to each day between an earliest grant date and a latest expiration date of each waiver in said database, and
      incrementing a corresponding counter of said array of counters for each waiver in said database for each day between a grant date and an expiration date of said each waiver.

6. The method of claim 2, further comprising:
   modifying, utilizing an entry tool, content of said database wherein said modifying comprises at least one of
   modifying existing content of said database, and
   adding content to said database associated with a new waiver.

7. A circuit arrangement to verify an electronic circuit design utilizing a design verification tool, said circuit arrangement comprising:
   an entry tool;
   a control unit;
   a visualizing tool;
   a database of defined waivers comprising a plurality of entries, each entry of said plurality of entries corresponding to a waiver and comprising a hardware component identifier and an associated defect type, wherein
      said design verification tool, during a verification run, ignores a found design defect in response to a determination that a corresponding waiver, defined to waive said found design defect, is present in said database of defined waivers, and
      each entry of said plurality of entries is further defined by metadata; and a waiver extractor to generate a list of waivers, wherein each waiver in said list of waivers is added in response to a determination that at least one given criterion is fulfilled by metadata associated with said waiver during a traversal, by said waiver extractor, of said database, wherein the at least one given criterion indicates a waiver validity period specified by at least one of a waiver expiration date and a waiver grant date.

8. The circuit arrangement according to claim 7, wherein said metadata comprise at least one of responsibility data, association data, and expiration data.

9. The circuit arrangement according to claim 7, wherein said database comprises at least one component of said electric circuit design grouped in a tree representing a chip hierarchy, wherein at least one waiver is associated with said at least one component.

10. A computer program product for verifying an electronic circuit, the computer program product comprising:
   a non-transitory computer readable storage medium having computer readable program code embodied therewith, the computer readable program code, when executed by a computer, causes said computer to perform a method comprising,
      issuing a request to perform a verification run on a component of an electric circuit design;
      receiving, in response to an issuance of said request, configuration data specifying a list of waivers extracted from a plurality of waivers applicable to said electric circuit design as a whole, wherein
         said list of waivers is extracted based upon waiver validity period data specifying at least one of a waiver expiration date and a waiver grant date, and
         said list of waivers is applicable to said component of said electric circuit design rather than said electric circuit design as a whole;
      identifying a potential design defect of said component of said electric circuit design; and
      generating a verification run result including a set of design defects of said component of said electric circuit design, wherein
         said set of design defects includes said potential design defect in response to a determination that no waiver of said list of waivers is applicable to said potential design defect, and
         said set of design defects excludes said potential design defect in response to a determination that at least one waiver of said list of waivers is applicable to said potential design defect.

11. The computer program product of claim 10, said method further comprising
   extracting said list of waivers utilizing a database of defined waivers comprising a plurality of entries, wherein each entry is associated with a hardware component identifier, an associated defect type, and metadata.

12. The computer program product of claim 11, wherein said metadata comprises at least one of responsibility data, association data, and expiration data.

13. The computer program product of claim 11, wherein
   said database comprises at least one component of said electric circuit design grouped in a tree representing a corresponding electronic circuit hierarchy, wherein at least one waiver is associated with each said at least one component; and
   said extracting comprises traversing said plurality of entries of said database to generate said list of waivers.

14. The computer program product of claim 11, wherein
   said method further comprises visualizing waiver data over time; and
   said visualizing comprises,
      creating an array of counters, each of said array of counters corresponding to each day between an earliest grant date and a latest expiration date of each waiver in said database, and
      incrementing a corresponding counter of said array of counters for each waiver in said database for each day between a grant date and an expiration date of said each waiver.

15. The computer program product of claim 11, said method further comprising:
   modifying, utilizing an entry tool, content of said database wherein said modifying comprises at least one of
   modifying existing content of said database, and
   adding content to said database associated with a new waiver.

* * * * *